United States Patent
Lee et al.

(10) Patent No.: US 9,997,228 B2
(45) Date of Patent: Jun. 12, 2018

(54) REFRESH CONTROL DEVICE WITH PLURALITY OF OSCILLATOR CIRCUITS

(71) Applicant: SK hynix Inc., Icheon-si, Gyeonggi-do (KR)

(72) Inventors: Jae Seung Lee, Yeoju-si (KR); Chang Hyun Kim, Seoul (KR); Yo Sep Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/288,003

(22) Filed: Oct. 7, 2016

(65) Prior Publication Data

US 2017/0352404 A1 Dec. 7, 2017

(30) Foreign Application Priority Data

Jun. 1, 2016 (KR) ........................ 10-2016-0068173

(51) Int. Cl.
*G11C 8/00* (2006.01)
*G11C 7/00* (2006.01)
*G11C 11/406* (2006.01)
*G11C 11/408* (2006.01)

(52) U.S. Cl.
CPC ...... *G11C 11/40615* (2013.01); *G11C 11/408* (2013.01); *G11C 11/40618* (2013.01); *G11C 2211/4061* (2013.01)

(58) Field of Classification Search
None
See application file for complete search history.

(56) References Cited

U.S. PATENT DOCUMENTS

| 4,775,959 | A | * | 10/1988 | Sato | G11C 5/146 |
| | | | | | 365/189.09 |
| 6,005,824 | A | * | 12/1999 | Crafts | G11C 7/22 |
| | | | | | 365/194 |
| 9,698,799 | B2 | * | 7/2017 | Liu | H03L 7/102 |
| 2015/0009768 | A1 | * | 1/2015 | Jang | G11C 11/4076 |
| | | | | | 365/194 |
| 2016/0043727 | A1 | | 2/2016 | Han | |

FOREIGN PATENT DOCUMENTS

KR 1020070041956 A 4/2007

* cited by examiner

*Primary Examiner* — Son Dinh
*Assistant Examiner* — Sultana Begum
(74) *Attorney, Agent, or Firm* — William Park & Associates Ltd.

(57) ABSTRACT

A refresh control device, and a memory device may be provided. The latch controller may include a first oscillator configured to generate a first oscillation signal, and a second oscillator configured to generate a second oscillation signal. The latch controller may be configured to receive a precharge signal and prevent the second oscillation signal from being synchronized with the precharge signal.

4 Claims, 13 Drawing Sheets

REFRESH CONTROL DEVICE WITH PLURALITY OF OSCILLATOR CIRCUITS

CROSS-REFERENCE TO RELATED APPLICATION

This application claims priority based upon Korean patent application No. 10-2016-0068173, filed on Jun. 1, 2016, the disclosure of which is hereby incorporated in its entirety by reference herein.

BACKGROUND

1. Technical Field

Embodiments of the present disclosure may generally relate to a latch controller, refresh control device, and a memory device including the same, and more particularly to a technology related to refresh.

2. Related Art

With increasing integration of semiconductor memory devices, a distance between a plurality of word lines contained in the semiconductor memory device has been gradually reduced, resulting in an increased coupling effect between contiguous word lines.

Word lines are toggled between an active state and an inactive state whenever data is input and output to and from memory cells. However, with the increase in coupling effects between contiguous word lines, data of memory cells coupled to word lines contiguous to frequently activated word lines is unavoidably damaged or lost.

The above data damage phenomenon is referred to as word line disturbance. Due to the occurrence of such word line disturbance, data stored in the memory cells may be damaged or lost before each memory cell is refreshed.

SUMMARY

In accordance with an embodiment, a latch controller may be provided. In accordance with an embodiment of the present disclosure, a refresh control device may be provided. In accordance with an embodiment of the present disclosure, a memory device may be provided. The latch controller may include a first oscillator configured to generate a first oscillation signal, and a second oscillator configured to generate a second oscillation signal. The latch controller may be configured to receive a precharge signal and prevent the second oscillation signal from being synchronized with the precharge signal.

In accordance with an embodiment, a latch controller comprising: a first oscillator configured to generate a first oscillation signal; a second oscillator configured to generate a second oscillation signal; a counter configured to generate a pre-enable signal synchronized with the first oscillation signal based on a precharge signal; a binary code generator configured to generate a random binary code signal having a random pattern period based on the second oscillation signal; and a combination circuit configured to prevent the second oscillation signal from being synchronized with the precharge signal.

In accordance with an embodiment, a refresh control device comprising: a first oscillator configured to generate a first oscillation signal; a second oscillator configured to generate a second oscillation signal; a counter configured to generate a pre-enable signal synchronized with the first oscillation signal based on a precharge signal; and a combination circuit configured to output a latch enable signal based on the second oscillation signal and the pre-enable signal.

In accordance with an embodiment, a refresh control device comprising: a first oscillator configured to generate a first oscillation signal; a second oscillator configured to generate a second oscillation signal; a counter configured to generate a pre-enable signal synchronized with the first oscillation signal based on a precharge signal; a binary code generator configured to generate a random binary code signal formed in a random pulse shape based on the second oscillation signal; and a combination circuit configured to output a latch enable signal based on the random binary code signal and the pre-enable signal.

In accordance with an embodiment, a refresh control device comprising: a first oscillator configured to generate a first oscillation signal; a second oscillator configured to generate a second oscillation signal; a counter configured to generate a pre-enable signal synchronized with the first oscillation signal based on a precharge signal; a binary code generator configured to generate a random binary code signal formed in a random pulse shape based on the second oscillation signal; and a selection circuit configured to select any one of the random binary code signal and the pre-enable signal based on a selection signal, and output the selected one as a latch enable signal.

In accordance with an embodiment, a memory device comprising: a refresh controller configured to output a latch enable signal synchronized by at least two source signals having different time periods, latch an input row address synchronized with the latch enable signal, and output a smart refresh signal needed to perform a smart refresh operation; and a bank in which the smart refresh operation is carried out based on the smart refresh signal.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a refresh control device and a memory device including the same that may substantially obviate one or more problems due to limitations and disadvantages of the related art.

An embodiment of the present disclosure may generally relate to a refresh control device and a memory device including the same, which can randomize operations of a latch during a smart refresh operation.

Figure 1:
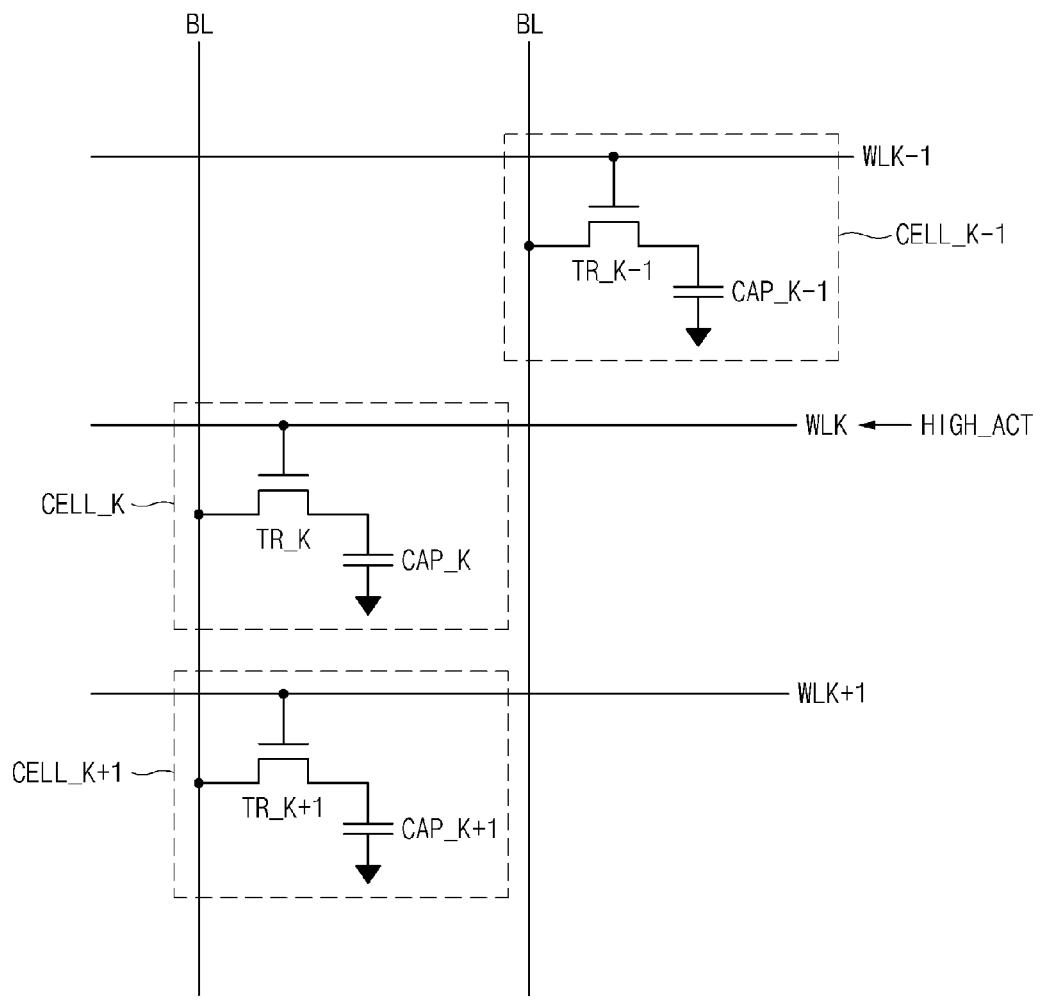
FIG. 1 is a circuit diagram illustrating a representation of an example of some parts of a cell array contained in a memory device to explain the word line disturbance phenomenon.

FIG. 1 is a circuit diagram illustrating some parts of a cell array contained in a memory device to explain the word line disturbance phenomenon.

Referring to FIG. 1, 'WLK' may refer to a word line having a large number of activation times, and 'WLK−1' and 'WLK+1' may refer to contiguous word lines located adjacent to the word line 'WLK'. 'CELL_K' may refer to a memory cell coupled to the word line 'WLK' and bit line BL, 'CELL_K−1' may refer to a memory cell coupled to the contiguous word line 'WLK−1', and 'CELL_K+1' may refer to a memory cell coupled to the other contiguous word line 'WLK+1'. A first memory cell may include a cell transistor TR_K and a cell capacitor CAP_K, a second memory cell may include a cell transistor TR_K−1 and a cell capacitor CAP_K−1, and a third memory cell may include a cell transistor TR_K+1 and a cell capacitor CAP_K+1.

Referring to FIG. 1, if the word line 'WLK' is activated or deactivated, the voltages of the contiguous word lines (WLK−1, WLK+1) are increased or reduced due to occurrence of the coupling effect between one word line WLK and the contiguous word lines (WLK−1, WLK+1), such that the amount of charges of the cell capacitors (CAP_K, CAP_K−1, CAP_K+1) may be affected.

Therefore, if the word line WLK is toggled between an active state and an inactive state because the word line WLK is frequently activated, the amount of charges stored in cell capacitors (CAP_K−1, CAP_K+1) contained in the memory cells (CELL_K−1, CELL_K+1) may be greatly changed, and data of each memory cell may be deteriorated.

Electromagnetic waves generated when the word line is toggled between the active state and the inactive state may allow electrons to be introduced into a cell capacitor of a memory cell coupled to a contiguous word line or may allow electrons to be discharged from the cell capacitor, such that data is damaged or lost.

A specific word line (e.g., WLK) is repeatedly activated (i.e., HIGH_ACT) at least a predetermined number of times such that data of memory cells coupled to the contiguous word lines (e.g., WLK+1, WLK−1) may be deteriorated. This data deterioration phenomenon will hereinafter be referred to as the row hammer phenomenon. A representative example for addressing this issue is to activate contiguous word lines (WLK+1, WLK−1) located adjacent to the excessively activated word line (WLK).

Since the contiguous word lines (WLK+1, WLK−1) are activated, data of memory cells coupled to the contiguous word lines (WLK+1, WLK−1) is rewritten and prevented from being damaged or lost.

A semiconductor device such as a DRAM includes a large number of memory cells, and each memory cell includes a transistor acting as a switch and a capacitor storing data therein. However, since a leakage current occurs due to a memory cell structure such as a PN junction of a transistor, initial data stored in the capacitor may disappear. Therefore, a refresh operation for recharging data in memory cells prior to data disappearance is needed.

A normal refresh operation may be classified into an auto-refresh mode, a self-refresh mode, etc. During the auto-refresh mode, the semiconductor device performs a refresh operation upon receiving a refresh command from an external part. During the self-refresh mode, the semiconductor device performs a refresh operation while simultaneously sequentially changing internal addresses according to a refresh command received from the external part.

In recent times, in addition to execution of the normal refresh operation, the semiconductor device further performs an additional refresh operation for a row having a high possibility of losing data due to occurrence of the row hammer phenomenon. The row hammer phenomenon may indicate that data of memory cells coupled to the corresponding row or contiguous rows thereof is damaged or lost due to a high number of activation times.

Accordingly, the embodiments of the present disclosure randomize addresses applied to a smart refresh latch circuit during a smart refresh operation to equalize the accessed addresses, resulting in reduction of the number of failed or defective parts caused by row hammering.

Figure 2:
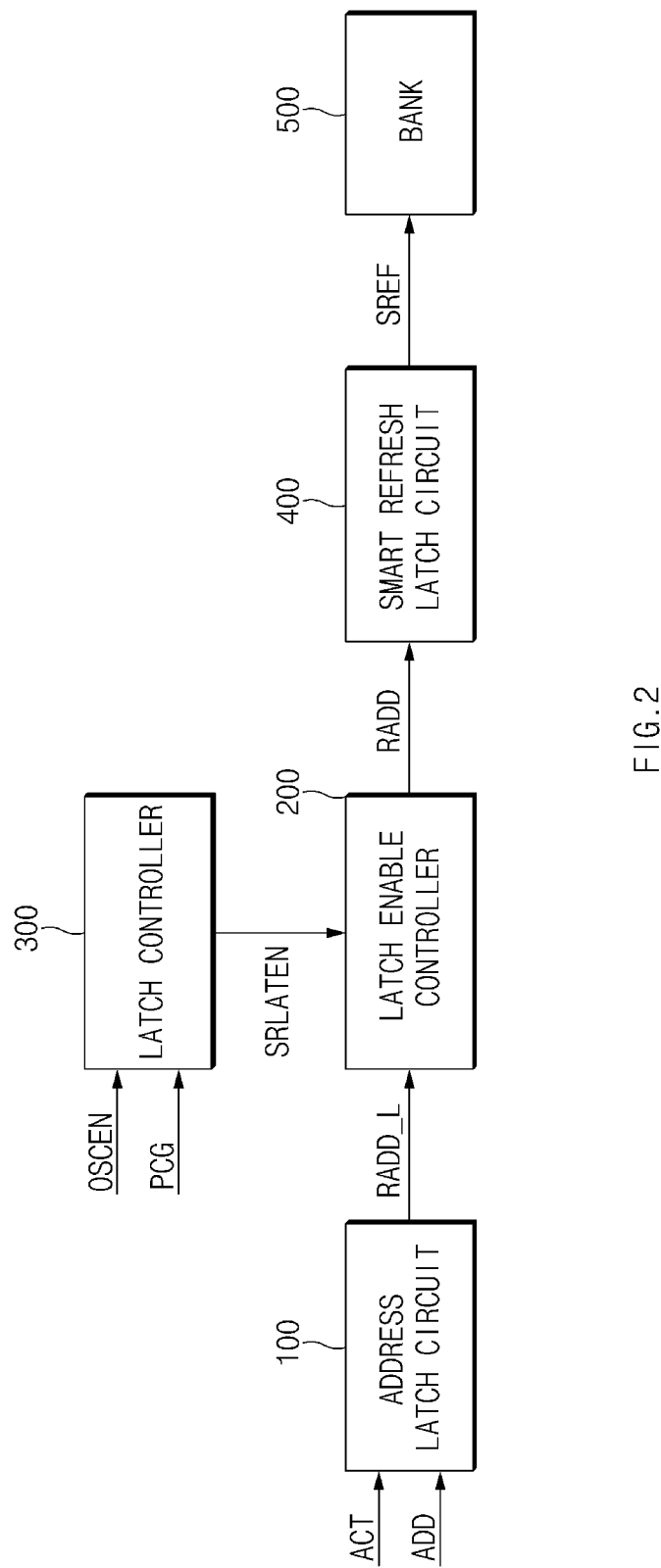
FIG. 2 is a block diagram illustrating a representation of an example of a memory device according to an embodiment of the present disclosure.

FIG. 2 is a block diagram illustrating a memory device according to an embodiment of the present disclosure.

Referring to FIG. 2, the memory device may include an address latch circuit 100, a latch enable controller 200, a latch controller 300, a smart refresh latch circuit 400, and a bank 500. In this case, the address latch circuit 100, the latch enable controller 200, the latch controller 300, and the smart refresh latch circuit 400 may be generically referred to as a refresh controller or refresh control device.

The address latch circuit 100 may latch an input address (ADD) in response to an active signal (ACT), and may output a latch address (RADD_L). In this case, the address (ADD) may be received from an external controller (not illustrated).

In response to a latch enable signal (SRLATEN), the latch enable controller 200 may output the latch address (RADD_L) as a row address (RADD). For example, if the latch enable signal (SRLATEN) is activated, the latch enable controller 200 may output the latch address (RADD_L) as the row address (RADD). If the latch enable signal (SRLATEN) is deactivated, the latch enable controller 200 may prevent output of the row address (RADD).

The latch controller 300 may output the latch enable signal (SRLATEN) for controlling the operation of the latch enable controller 200 in response to an oscillation enable signal (OSCEN) and a precharge signal (PCG).

The smart refresh latch circuit 400 may latch the row address (RADD), and may output a smart refresh signal (SREF) for controlling the smart refresh operation. In the bank 500, the smart refresh operation is performed in response to the smart refresh signal (SREF).

As semiconductor devices progress and the degree of technology shrinks, a pitch between contiguous word lines is gradually reduced, the amount of lost data caused by the row hammer phenomenon is unavoidably increased and refresh characteristics are deteriorated due to such row hammering. The row hammer phenomenon may indicate that, when only a specific row line is repeatedly activated and precharged, refresh failures occur in upper and lower word lines adjacent to a target word line such that cell data of the contiguous word lines (i.e., the upper and lower word lines adjacent to the target word line) is damaged or lost.

If a user repeatedly activates and precharges a word line having a specific address to address the above-mentioned issues, a specific row line repeatedly activated is sampled such that an address corresponding to the sampled result is stored. Thereafter, if a subsequent refresh command is applied to the memory device, upper and lower word lines adjacent to a specific row line are refreshed through an adder-subtractor in the memory device. The above-mentioned refresh operation of the upper and lower word lines contiguous to the specific row line will hereinafter be referred to as a smart refresh operation.

With the rapid progress in memory device (e.g., DRAM) scaling, there arises a row hammer phenomenon in which, when a specific row (N-th line) is accessed, data of contiguous rows (N+1 line, N−1 line) located in the vicinity of the specific row (N-th line) is lost or damaged. In order to address the row hammer phenomenon, the address latch circuit 100 may latch an input address (ADD) in response to the active signal (ACT).

If the latch enable signal (SRLATEN) for preventing occurrence of the row hammer is activated, the smart refresh signal (SREF) is activated by the smart refresh latch circuit 400, such that the refresh operation of a row line adjacent to the latched address (ADD) is carried out.

In this case, in order to improve efficiency of the smart refresh operation, the row address (RADD) to be applied to the smart refresh latch circuit 400 needs to be latched at random. For example, assuming that two row addresses are accessed with respect to a single bank 500, the two row addresses need to be smart-refreshed in a substantially uniform manner such that occurrence of the row hammer phenomenon is prevented. The operation for refreshing the row addresses in a substantially uniform manner may be determined by the degree of randomization of the operation of the smart refresh latch circuit 400.

Figure 3:
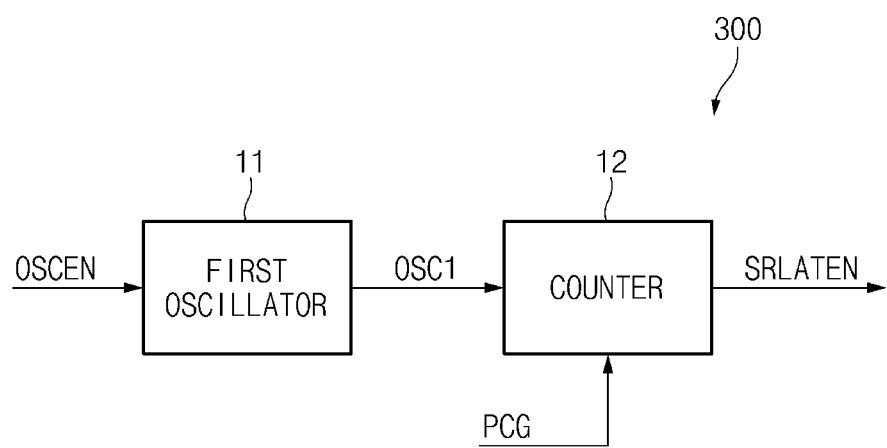
FIG. 3 is a conceptual diagram illustrating the operations of a latch controller.

FIG. 3 is a conceptual diagram illustrating the operations of the latch controller 300.

Referring to FIG. 3, the latch controller 300 may include a first oscillator 11 and a counter 12. In this case, the first oscillator 11 may generate an oscillation signal (OSC1) having a predetermined time period when the oscillation enable signal (OSCEN) is activated. The counter 12 may generate the latch enable signal (SRLATEN) synchronized with the oscillation signal (OSC1) in response to the precharge signal (PCG).

Figure 4:
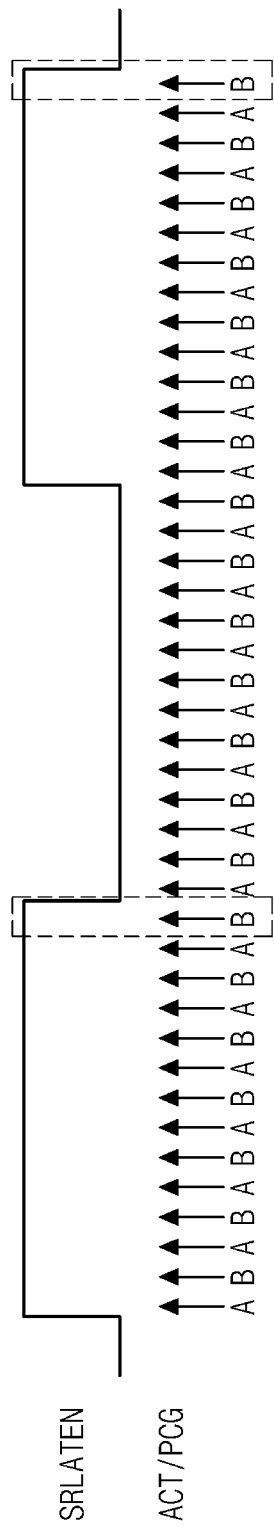
FIG. 4 is a timing diagram illustrating the operations of the latch controller illustrated in FIG. 3.

FIG. 4 is a timing diagram illustrating the operations of the latch controller 300 illustrated in FIG. 3.

Referring to FIG. 4, the counter 12 may shift the oscillation signal (OSC1) using the precharge signal (PCG), and may thus output the latch enable signal (SRLATEN). If the latch enable signal (SRLATEN) is activated, the latch enable controller 200 starts operation such that the latch address (RADD_L) is output as the row address (RADD).

That is, during a high pulse section of the latch enable signal (SRLATEN), the latch address (RADD_L) latched by the address latch circuit 100 is output as the row address (RADD) to the smart refresh latch circuit 400.

In this case, a source signal of the latch enable signal (SRLATEN) is an oscillation signal (OSC1) of the first oscillator 11. Therefore, a time period of the latch enable signal (SRLATEN) may be identical to a time period of the oscillation signal (OSC1).

However, if the latch enable signal (SRLATEN) is generated using only one first oscillator 11, only a specific address is synchronized such that the row hammer phenomenon may occur in the remaining unsynchronized addresses other than the specific address.

For example, it is assumed that a first address (A) and a second address (B) are activated on the condition that a time period of an external refresh command is similar to a time period of the oscillation signal (OSC1). As a result, a time period of the latch enable signal (SRLATEN) may also be similar to a time period of the refresh command.

During a high level section of the latch enable signal (SRLATEN), the first and second addresses A and B in which smart refresh is performed may be latched. In this case, only one address (e.g., the second address B) from among the first address A and the second address B is synchronized with the latch enable signal (SRLATEN) and is then smart-refreshed. As a result, occurrence of the row hammer caused by the remaining one address (e.g., the first address A) from among the first address A and the second address B may be inevitable or unavoidable.

Accordingly, the embodiments of the present disclosure may control the latch controller 300 for selectively transmitting an address to the smart refresh latch circuit 400 latching the address to more randomly latch the address.

Figure 5:
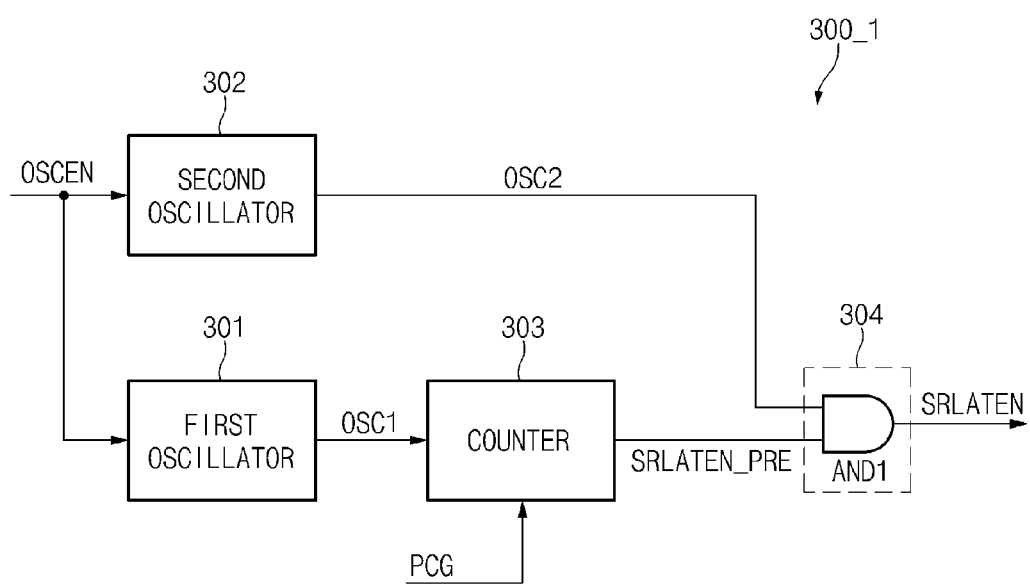
FIG. 5 is a circuit diagram illustrating the latch controller illustrated in FIG. 2.

FIG. 5 is a circuit diagram illustrating the latch controller 300 illustrated in FIG. 2.

Referring to FIG. 5, the latch controller 300 may be implemented by various embodiments. The latch controller 300 illustrated in FIG. 5 will hereinafter be referred to as a latch controller (300_1) for convenience of description. The latch controller (300_1) may include a first oscillator 301, a second oscillator 302, a counter 303, and a combination circuit 304.

The latch controller (300_1) may include not only the first oscillator 301 but also the second oscillator 302 to prevent an external refresh command from being synchronized with an internal oscillation signal.

In this case, the first oscillator 301 may generate an oscillation signal (OSC1) having a predetermined time period when an oscillation enable signal (OSCEN) is activated. The second oscillator 302 may generate an oscillation signal (OSC2) having a predetermined time period when the oscillation enable signal (OSCEN) is activated. The counter 303 may generate a pre-enable signal (SRLATEN_PRE) synchronized with the oscillation signal (OSC1) in response to a precharge signal (PCG).

The combination circuit 304 may combine the oscillation signal (OSC2) with the pre-enable signal (SRLATEN_PRE) and thus output a latch enable signal (SRLATEN). The combination circuit 304 may perform a logic operation, for example but not limited to an AND operation. For example, the combination circuit 304 may include an AND gate (AND1) configured to perform a logic AND operation between the oscillation signal (OSC2) and the pre-enable signal (SRLATEN_PRE) to output the latch enable signal (SRLATEN). That is, the combination circuit 304 may activate the latch enable signal (SRLATEN) only when both the oscillation signal (OSC2) and the pre-enable signal (SRLATEN_PRE) are activated, and may output the activated latch enable signal (SRLATEN).

Figure 6:
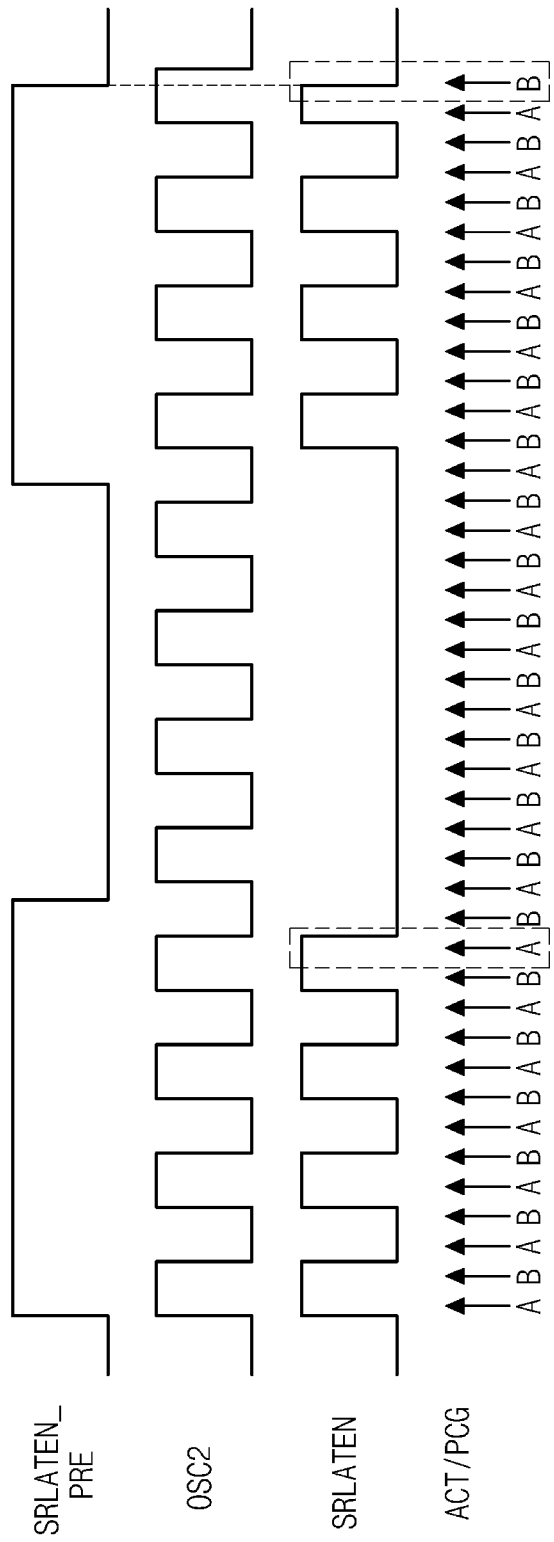
FIG. 6 is a timing diagram illustrating the operations of the latch controller illustrated in FIG. 5.

FIG. 6 is a timing diagram illustrating the operations of the latch controller (300_1) illustrated in FIG. 5.

Referring to FIG. 6, when the oscillation enable signal (OSCEN) is activated, the first oscillator 301 may generate the oscillation signal (OSC1) having a predetermined time period. The second oscillator 302 may generate the oscillation signal (OSC2) having a predetermined time period when the oscillation enable signal (OSCEN) is activated. In this case, the time period of the oscillation signal (OSC1) may be different from the time period of the oscillation signal (OSC2).

The counter 303 may generate the pre-enable signal (SRLATEN_PRE) synchronized with the oscillation signal (OSC1) in response to the precharge signal (PCG). During a high pulse section of the pre-enable signal (SRLATEN_PRE), the combination circuit 304 may output the latch enable signal (SRLATEN) synchronized with the oscillation signal (OSC2).

In this case, a source signal of the pre-enable signal (SRLATEN_PRE) may be identical to the oscillation signal (OSC1) of the first oscillator 301. The source signal of the latch enable signal (SRLATEN) may be achieved by combining the pre-enable signal (SRLATEN_PRE) with the oscillation signal (OSC2).

Therefore, the latch enable signal (SRLATEN) may be generated by a combination of two oscillation signals (OSC1, OSC2) having different time periods. When the latch enable signal (SRLATEN) is generated using two source signals, not only a specific address but also a plurality of addresses may be synchronized at random during the active operation.

For example, it is assumed that a first address A and a second address B are activated on the condition that a time period of the external refresh command is similar to a time period of the oscillation signal (OSC1). Thus, a time period of the pre-enable signal (SRLATEN_PRE) may be similar to a time period of the refresh command. In this case, each of the first address A and the second address B may correspond to a row address.

Each arrow (A) and each arrow (B) illustrated in FIG. 6 may denote the active operation (or precharge operation) of the first address A and the active operation (or precharge operation) of the second address B, respectively.

Accordingly, the first address A and the second address B are randomly synchronized with the latch enable signal (SRLATEN) in such a manner that both the first address A and the second address B are latched, resulting in execution of the smart refresh operation.

That is, although the time period of the external refresh command is synchronized with the time period of the oscillation signal (OSC1), the oscillation signal (OSC2) may be generated by a separate source signal. That is, the oscillation signal (OSC2) may not be synchronized with the external active signal (or precharge signal).

In this case, the final output latch enable signal (SRLATEN) is not synchronized with the time period of the external refresh command. Accordingly, an embodiment of the present disclosure may control the latch controller (300_1) to more randomly latch the row address (RADD).

Figure 7:
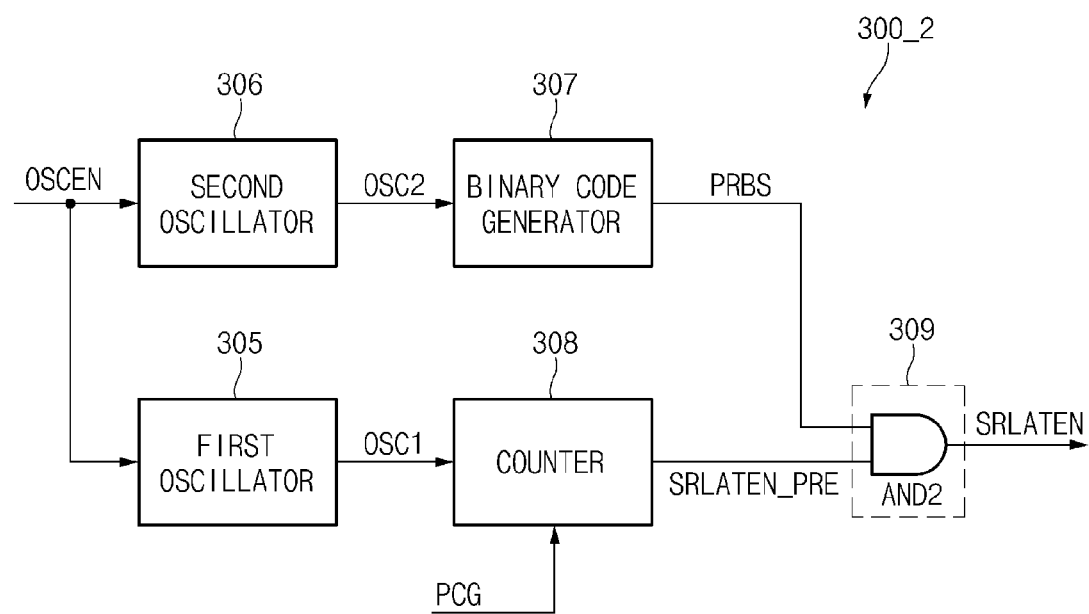
FIG. 7 is a detailed block diagram illustrating the latch controller illustrated in FIG. 2 according to an embodiment of the present disclosure.

FIG. 7 is a block diagram illustrating the latch controller 300 illustrated in FIG. 2 according to an embodiment of the present disclosure.

Referring to FIG. 7, the latch controller 300 may be implemented by various embodiments. The latch controller 300 illustrated in FIG. 7 will hereinafter be referred to as a latch controller (300_2) for convenience of description. The latch controller (300_2) may include a first oscillator 305, a second oscillator 306, a binary code generator 307, a counter 308, and a combination circuit 309.

The latch controller (300_1) may include not only the first oscillator 305 but also the second oscillator 306 and the binary code generator 307 to prevent an external refresh command from being synchronized with an internal oscillation signal.

In this case, the first oscillator 305 may generate an oscillation signal (OSC1) having a predetermined time period when the oscillation enable signal (OSCEN) is activated. The second oscillator 306 may generate an oscillation signal (OSC2) having a predetermined time period when the oscillation enable signal (OSCEN) is activated.

The binary code generator 307 may generate a random binary code signal corresponding to the oscillation signal (OSC2). In this case, the random binary code signal may be a Pseudo Random Binary Sequence (PRBS) signal. The counter 308 may generate the pre-enable signal (SRLATEN_PRE) synchronized with the oscillation signal (OSC1) in response to the precharge signal (PCG).

The combination circuit 309 may combine the random binary code signal (PRBS) with the pre-enable signal (SRLATEN_PRE), and thus output the latch enable signal (SRLATEN). The combination circuit 309 may perform a logic operation, for example but not limited to an AND operation. For example, the combination circuit 309 may include an AND gate (AND2) for performing a logic AND operation between the random binary code signal (PRBS) and the pre-enable signal (SRLATEN_PRE) to output the latch enable signal (SRLATEN). That is, the combination circuit 309 may activate the latch enable signal (SRLATEN) only when both the random binary code signal (PRBS) and the pre-enable signal (SRLATEN_PRE) are activated, and may output the activated latch enable signal (SRLATEN).

Figure 8:
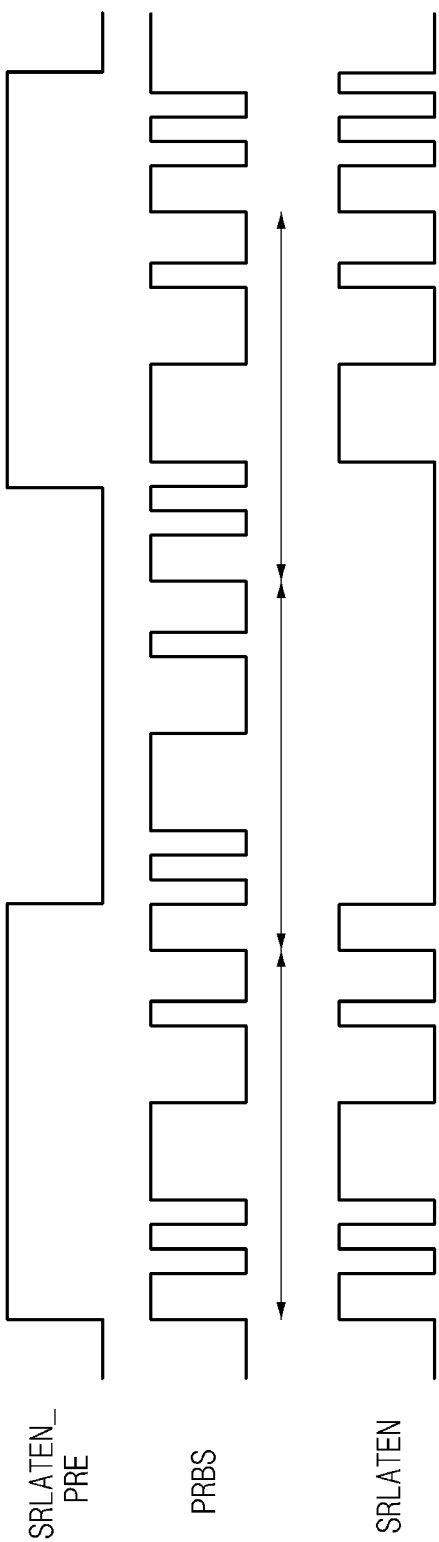
FIG. 8 is a timing diagram illustrating the operations of the latch controller illustrated in FIG. 7.

FIG. 8 is a timing diagram illustrating the operations of the latch controller (300_2) illustrated in FIG. 7.

Referring to FIG. 8, when the oscillation enable signal (OSCEN) is activated, the first oscillator 305 may generate the oscillation signal (OSC1) having a predetermined time period. The second oscillator 306 may generate the oscillation signal (OSC2) having a predetermined time period when the oscillation enable signal (OSCEN) is activated. In this case, the time period of the oscillation signal (OSC1) may be different from the time period of the oscillation signal (OSC2).

The counter 308 may generate the pre-enable signal (SRLATEN_PRE) synchronized with the oscillation signal (OSC1) in response to the precharge signal (PCG). The binary code generator 307 may generate a random binary code signal (PRBS) having a random pattern period.

During a high pulse section of the pre-enable signal (SRLATEN_PRE), the combination circuit 309 may output the random binary code signal (PRBS) synchronized with the oscillation signal (OSC2). That is, the combination circuit 309 may combine the random-pulse-shaped random binary code signal (PRBS) with the pre-enable signal (SRLATEN_PRE), instead of performing a combination of the oscillation signal (OSC2) generated from the second oscillator 306.

In this case, a source signal of the pre-enable signal (SRLATEN_PRE) may be identical to the oscillation signal (OSC1) of the first oscillator 305. The source signal of the latch enable signal (SRLATEN) may be achieved by combining the pre-enable signal (SRLATEN_PRE) with the random binary code signal (PRBS).

Therefore, the latch enable signal (SRLATEN) may be generated by a combination of two oscillation signals (OSC1, OSC2) having different time periods. When the latch enable signal (SRLATEN) is generated using two source signals, not only a specific address but also a plurality of addresses may be synchronized at random during the active operation.

For example, the binary code generator 307 may output a signal having 15 random pulses. As a result, as can be seen from FIG. 8, the binary code generator 307 may receive a 15-bit sequence "110101111000100" and output a random binary code signal (PRBS). In this case, although the order of the 15-bit sequence may be changed according to a PRBS circuit structure, the number of data "1" contained in the 15-bit sequence remains constant due to PRBS characteristics.

During a high pulse section of the pre-enable signal (SRLATEN_PRE), the random latch enable signal (SRLATEN) synchronized with the random binary code signal (PRBS) may be generated.

If the latch enable signal (SRLATEN) is generated using the oscillation signal (OSC1) generated from the first oscillator 305, only the output frequency components of the first oscillator 305 are contained in the latch enable signal (SRLATEN). However, when using the random binary code signal (PRBS), frequency components corresponding to an integer multiple of the oscillation period may occur. In other words, through more random frequency generation, the address latch operation may be randomized during the smart refresh operation.

Figure 9:
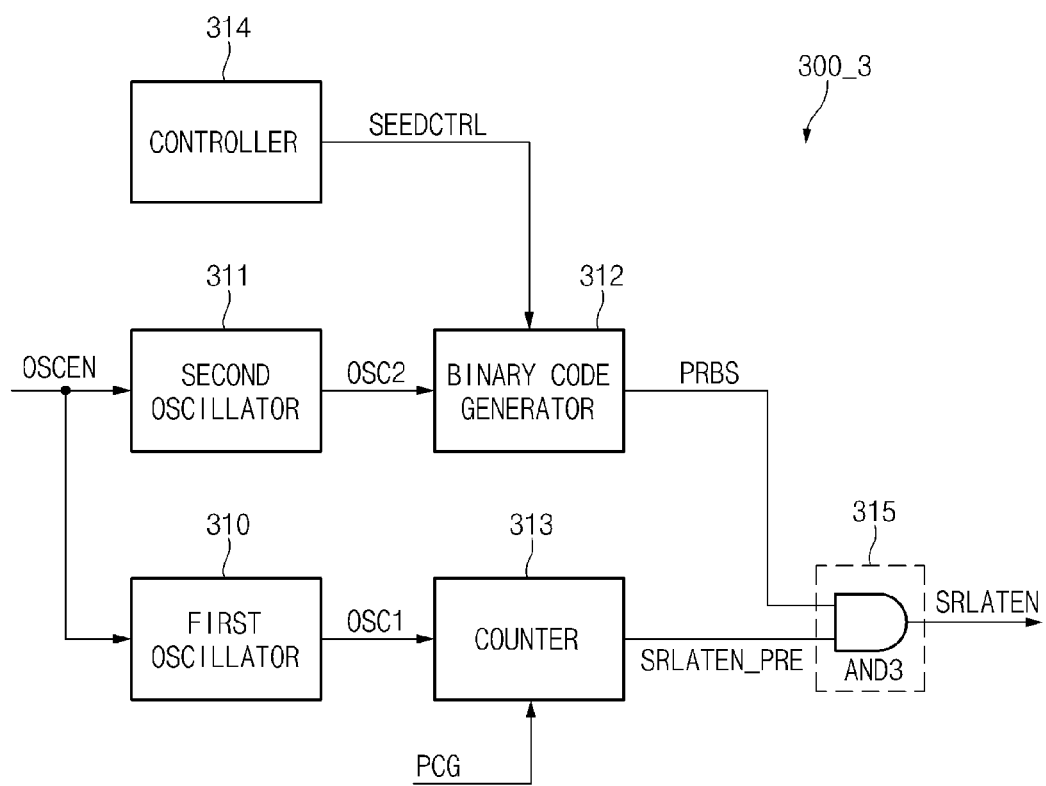
FIG. 9 is a detailed block diagram illustrating the latch controller illustrated in FIG. 2 according to an embodiment of the present disclosure.

FIG. 9 is a block diagram illustrating the latch controller 300 illustrated in FIG. 2 according to an embodiment of the present disclosure.

Referring to FIG. 9, the latch controller 300 may be implemented by various embodiments. The latch controller 300 illustrated in FIG. 9 will hereinafter be referred to as a latch controller (300_3) for convenience of description. The latch controller (300_3) may include a first oscillator 310, a second oscillator 311, a binary code generator 312, a counter 313, controller 314, and a combination circuit 315.

The latch controller (300_3) may include not only the first oscillator 310 but also the second oscillator 311, the binary code generator 312, and the controller 314 to prevent an external refresh command from being synchronized with an internal oscillation signal.

In this case, the first oscillator 310 may generate an oscillation signal (OSC1) having a predetermined time period when the oscillation enable signal (OSCEN) is activated. The second oscillator 311 may generate an oscillation signal (OSC2) having a predetermined time period when the oscillation enable signal (OSCEN) is activated.

The binary code generator 312 may generate a random binary code signal corresponding to the oscillation signal (OSC2) according to a control signal (SEEDCTRL). In this case, the random binary code signal may be a Pseudo Random Binary Sequence (PRBS) signal.

For example, the binary code generator 312 may include a plurality of chained flip-flops. If the input signal applied to the binary code generator 312 is changed according to the control signal (SEEDCTRL), the order of final output signals is changed such that the binary code generator 312 may generate a random binary code signal (PRBS) having various shapes.

The controller 314 may generate the control signal (SEEDCTRL) having a time variant logic level. The counter 313 may generate the pre-enable signal (SRLATEN_PRE) synchronized with the oscillation signal (OSC1) in response to the precharge signal (PCG).

The combination circuit 315 may combine the random binary code signal (PRBS) with the pre-enable signal (SRLATEN_PRE), and thus output the latch enable signal (SRLATEN). The combination circuit 315 may perform a logic operation, for example but not limited to an AND operation. For example, the combination circuit 315 may include an AND gate (AND3) for performing a logic AND operation between the random binary code signal (PRBS) and the pre-enable signal (SRLATEN_PRE) to output the latch enable signal (SRLATEN). That is, the combination circuit 315 may activate the latch enable signal (SRLATEN) only when both the random binary code signal (PRBS) and the pre-enable signal (SRLATEN_PRE) are activated, and may output the activated latch enable signal (SRLATEN).

Figure 10:
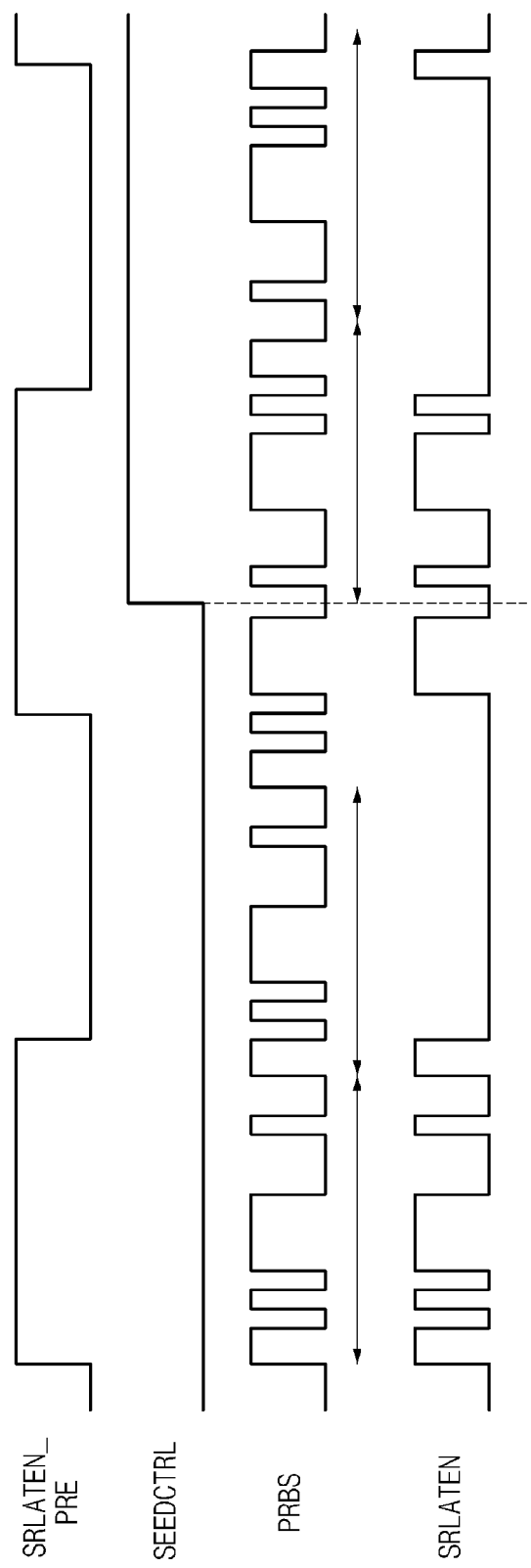
FIG. 10 is a timing diagram illustrating the operations of the latch controller illustrated in FIG. 9.

FIG. 10 is a timing diagram illustrating the operations of the latch controller (300_3) illustrated in FIG. 9.

Referring to FIG. 10, when the oscillation enable signal (OSCEN) is activated, the first oscillator 310 may generate the oscillation signal (OSC1) having a predetermined time period. The second oscillator 311 may generate the oscillation signal (OSC2) having a predetermined time period when the oscillation enable signal (OSCEN) is activated. In this case, the time period of the oscillation signal (OSC1) may be different from the time period of the oscillation signal (OSC2).

The counter 313 may generate the pre-enable signal (SRLATEN_PRE) synchronized with the oscillation signal (OSC1) in response to the precharge signal (PCG). The binary code generator 312 may generate a random binary code signal (PRBS) having a random pattern period in response to the control signal (SEEDCTRL).

During a high pulse section of the pre-enable signal (SRLATEN_PRE), the combination circuit 315 may output the latch enable signal (SRLATEN) synchronized with the random binary code signal (PRBS). That is, the combination circuit 315 may combine the random-pulse-shaped random binary code signal (PRBS) with the pre-enable signal (SRLATEN_PRE), instead of performing a combination of the oscillation signal (OSC2) generated from the second oscillator 311.

In this case, a source signal of the pre-enable signal (SRLATEN_PRE) may be identical to the oscillation signal (OSC1) of the first oscillator 310. The source signal of the latch enable signal (SRLATEN) may be achieved by combining the pre-enable signal (SRLATEN_PRE) with the random binary code signal (PRBS).

Therefore, the latch enable signal (SRLATEN) may be generated by a combination of two oscillation signals (OSC1, OSC2) having different time periods. When the latch enable signal (SRLATEN) is generated using two source signals, not only a specific address but also a plurality of addresses may be synchronized at random during the active operation.

For example, the binary code generator 315 may output a signal having 15 random pulses. As a result, as can be seen from FIG. 10, the binary code generator 315 may receive a 15-bit sequence "110101111000100" and output a random binary code signal (PRBS) when the control signal (SEEDCTRL) is at a logic low level (L). In this case, although the order of 15-bit sequence may be changed according to a PRBS circuit structure, the number of data "1" contained in the 15-bit sequence remains constant due to PRBS characteristics.

During a high pulse section of the pre-enable signal (SRLATEN_PRE), the random latch enable signal (SRLA- TEN) synchronized with the random binary code signal (PRBS) may be generated. If the control signal (SEEDCTRL) is at a logic low level (L) and at a logic high level (H), the order of the random binary code signal (PRBS) generated by the binary code generator 315 may be changed. For example, if the control signal (SEEDCTRL) is at a logic high level (H), the binary code generator 315 may receive a 15-bit sequence having a pattern "010001111010110" and may output the random binary code signal (PRBS).

Figure 11:
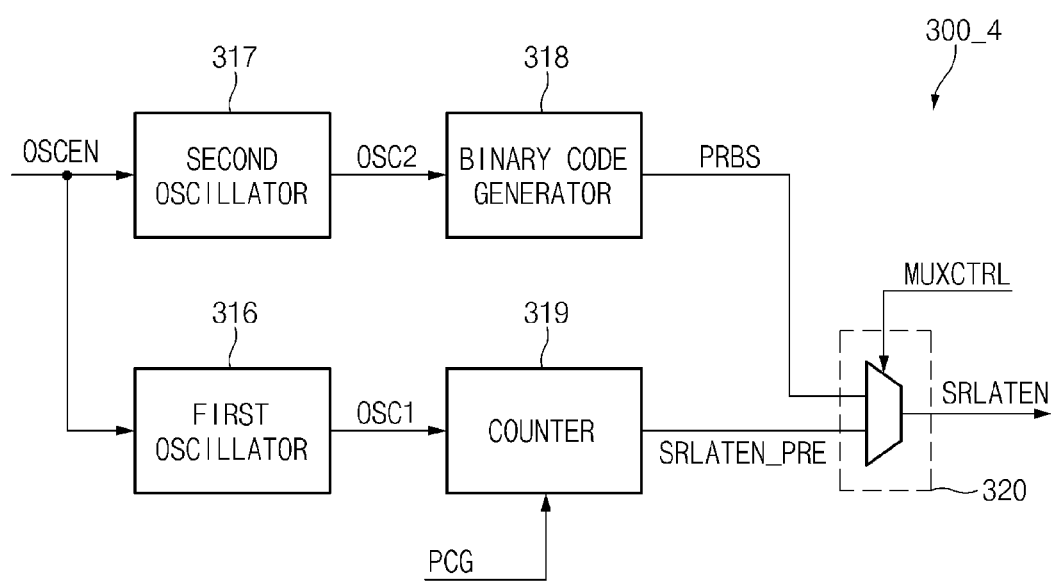
FIG. 11 is a detailed block diagram illustrating the latch controller illustrated in FIG. 2 according to an embodiment of the present disclosure.

FIG. 11 is a block diagram illustrating the latch controller 300 illustrated in FIG. 2 according to an embodiment of the present disclosure.

Referring to FIG. 11, the latch controller 300 may be implemented by various embodiments. The latch controller 300 illustrated in FIG. 11 will hereinafter be referred to as a latch controller (300_4) for convenience of description. The latch controller (300_4) may include a first oscillator 316, a second oscillator 317, a binary code generator 318, a counter 319, and a selection circuit 320.

The latch controller (300_4) may include not only the first oscillator 316 but also the second oscillator 317 and the binary code generator 318 to prevent an external refresh command from being synchronized with an internal oscillation signal.

In this case, the first oscillator 316 may generate an oscillation signal (OSC1) having a predetermined time period when the oscillation enable signal (OSCEN) is activated. The second oscillator 317 may generate an oscillation signal (OSC2) having a predetermined time period when the oscillation enable signal (OSCEN) is activated.

The binary code generator 318 may generate a random binary code signal corresponding to the oscillation signal (OSC2). In this case, the random binary code signal may be a Pseudo Random Binary Sequence (PRBS) signal. The counter 319 may generate the pre-enable signal (SRLATEN_PRE) synchronized with the oscillation signal (OSC1) in response to the precharge signal (PCG).

The selection circuit 320 may select any one of the random binary code signal (PRBS) and the pre-enable signal (SRLATEN_PRE) in response to a selection signal (MUXCTRL), and may output the selected one as the latch enable signal (SRLATEN). That is, the selection signal (MUXCTRL) may be a signal for changing a control frequency of the latch enable signal (SRLATEN).

The selection circuit 320 may include a multiplexer for selecting any one of the random binary code signal (PRBS) and the pre-enable signal (SRLATEN_PRE) in response to the selection signal (MUXCTRL) and outputting the selected one as the latch enable signal (SRLATEN).

For example, if the selection signal (MUXCTRL) is at a logic high level, the selection circuit 320 selects the random binary code signal (PRBS) and outputs the selected one as the latch enable signal (SRLATEN). If the selection signal (MUXCTRL) is at a logic low level, the selection circuit 320 selects the pre-enable signal (SRLATEN_PRE) and outputs the selected one as the latch enable signal (SRLATEN). Further, the logic levels of the signals may be different from or the opposite of those described. For example, a signal described as having a logic "high" level may alternatively have a logic "low" level, and a signal described as having a logic "low" level may alternatively have a logic "high" level.

Figure 12:
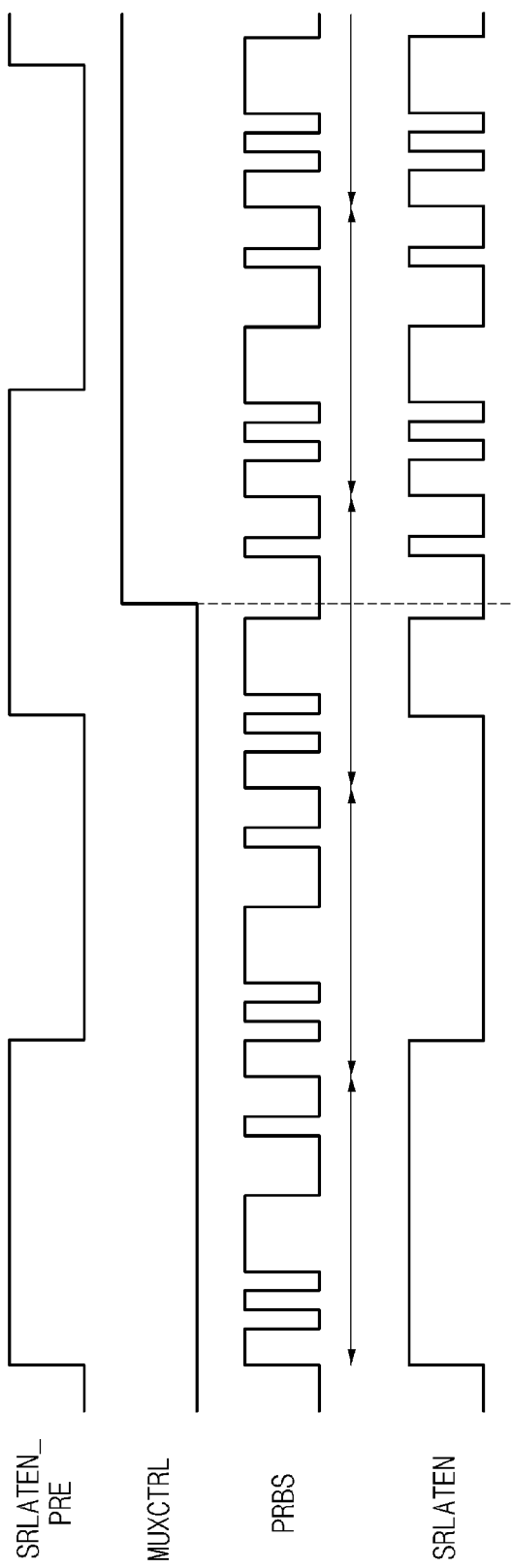
FIG. 12 is a timing diagram illustrating the operations of the latch controller illustrated in FIG. 11.

FIG. 12 is a timing diagram illustrating the operations of the latch controller (300_4) illustrated in FIG. 11.

Referring to FIG. 12, when the oscillation enable signal (OSCEN) is activated, the first oscillator 316 may generate the oscillation signal (OSC1) having a predetermined time period. The second oscillator 317 may generate the oscillation signal (OSC2) having a predetermined time period when the oscillation enable signal (OSCEN) is activated. In this case, the time period of the oscillation signal (OSC1) may be different from the time period of the oscillation signal (OSC2).

The counter 319 may generate the pre-enable signal (SRLATEN_PRE) synchronized with the oscillation signal (OSC1) in response to the precharge signal (PCG). The binary code generator 318 may generate a random binary code signal (PRBS) having a random pattern period.

During a high pulse section of the pre-enable signal (SRLATEN_PRE) in response to the selection signal (MUXCTRL), the selection circuit 320 may output the latch enable signal (SRLATEN) synchronized with the oscillation signal (OSC1), or may output the other latch enable signal (SRLATEN) synchronized with the random binary code signal (PRBS).

For example, if the selection signal (MUXCTRL) is at a logic low level, the selection circuit 320 may receive a signal synchronized with the pre-enable signal (SRLATEN_PRE) achieved using the oscillation signal (OSC1) as a source signal, and may output the received signal as the latch enable signal (SRLATEN). If the selection signal (MUXCTRL) is at a logic high level, the selection circuit 320 may receive a signal synchronized with the random binary code signal (PRBS) achieved using the oscillation signal (OSC2) as a source signal, and may output the received signal as the latch enable signal (SRLATEN).

The embodiments of the present disclosure have disclosed, for example, that a multiplexer (MUX) is applied to the embodiment of FIG. 11 for convenience of description. However, the scope or spirit of the present disclosure is not limited thereto, and it should be noted that the multiplexer instead of the combination circuit illustrated in FIGS. 5, 7 and 9 may also be applied to the embodiments.

As is apparent from the above description, the refresh control device and the memory device including the same according to embodiments of the present disclosure can randomize the operation of a latch during a smart refresh operation, resulting in increased refresh efficiency.

Figure 13:
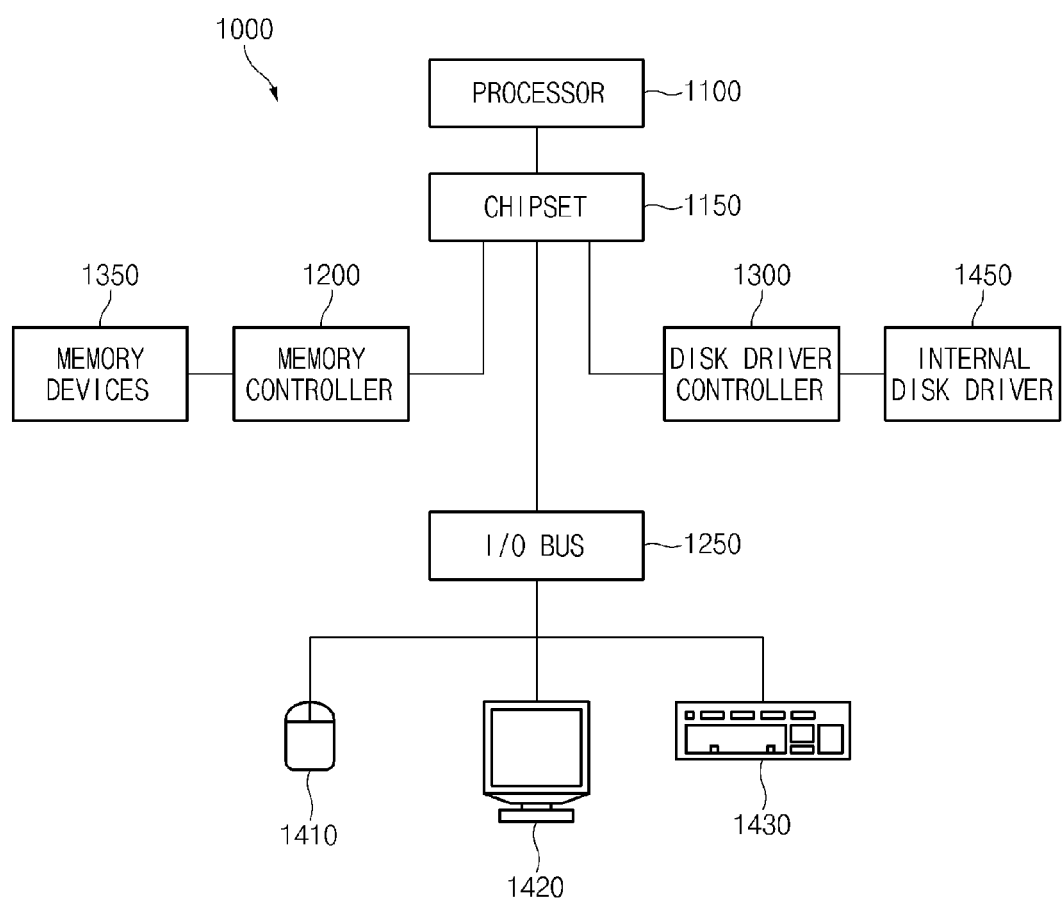
FIG. 13 illustrates a block diagram of an example of a representation of a system employing a latch controller, refresh control device, and or memory device with the various embodiments discussed above with relation to FIGS. 1-12.

The latch controllers, refresh control devices, and or memory devices as discussed above (see FIGS. 1-12) are particular useful in the design of other memory devices, processors, and computer systems. For example, referring to FIG. 13, a block diagram of a system employing a latch controller, refresh control device, and or memory device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one latch controller, refresh control device, and or memory device as discussed above with reference to FIGS. 1-12. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one latch controller, refresh control device, and or memory device as discussed above with relation to FIGS. 1-12, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 13 is merely one example of a latch controller, refresh control device, and or memory device as discussed above with relation to FIGS. 1-12. In alternate embodiments, such as, for example but not limited to, cellular phones or digital cameras, the components may differ from the embodiments illustrated in FIG. 13.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the embodiments should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A refresh control device comprising:
a first oscillator configured to generate a first oscillation signal having a predetermined time period;
a second oscillator configured to generate a second oscillation signal having a predetermined time period;
a counter configured to generate a pre-enable signal synchronized with the first oscillation signal based on a precharge signal; and
a combination circuit configured to output a latch enable signal based on the second oscillation signal and the pre-enable signal and prevent the second oscillation signal from being synchronized with the precharge signal,
wherein the second oscillation signal has a different time period than the first oscillation signal.

2. The refresh control device according to claim 1, wherein the combination circuit is configured to output the latch enable signal synchronized with the second oscillation signal during an activation section of the pre-enable signal.

3. The refresh control device according to claim 1, wherein the combination circuit, when the second oscillation signal and the pre-enable signal are activated, is configured to activate the latch enable signal and output the activated latch enable signal.

4. The refresh control device according to claim 1, wherein the combination circuit is configured to output the latch enable signal based on the second oscillation signal and the pre-enable signal.

* * * * *